United States Patent
Li

(10) Patent No.: US 11,890,722 B2
(45) Date of Patent: Feb. 6, 2024

(54) CHEMICAL MECHANICAL POLISHING SLURRY BUILDUP MONITORING

(71) Applicant: Applied Materials, Inc., Santa Clara, CA (US)

(72) Inventor: Thomas Ho Fai Li, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 267 days.

(21) Appl. No.: 17/222,001

(22) Filed: Apr. 5, 2021

(65) Prior Publication Data

US 2022/0314395 A1     Oct. 6, 2022

(51) Int. Cl.
     *B24B 49/12*        (2006.01)
     *B24B 37/005*      (2012.01)
     *H01L 21/321*      (2006.01)

(52) U.S. Cl.
     CPC ............ *B24B 49/12* (2013.01); *B24B 37/005* (2013.01); *H01L 21/3212* (2013.01)

(58) Field of Classification Search
CPC ....... B24B 49/12; B24B 37/005; B24B 37/14; B24B 37/24; B24B 37/30; B24B 49/18; H01L 21/3212; G01N 21/55; G01N 21/41; G01N 2021/174; G01N 2021/4766; G01N 2021/4769; G01N 2021/4771; G01N 2021/8904; G01N 21/64; G01N 21/91; G01J 2003/468
USPC ............................ 451/6, 8, 56, 60, 444, 446
See application file for complete search history.

(56) References Cited

U.S. PATENT DOCUMENTS

| | | | |
|---|---|---|---|
| 7,029,365 B2 | 4/2006 | Chang et al. | |
| 2015/0107624 A1* | 4/2015 | Sumiyoshi | B23Q 11/0075 250/461.1 |
| 2019/0224723 A1* | 7/2019 | Mostovoy | B08B 13/00 |
| 2019/0283209 A1* | 9/2019 | Osterheld | B24B 37/013 |
| 2021/0053184 A1* | 2/2021 | Chen | B24B 37/12 |

FOREIGN PATENT DOCUMENTS

| | | |
|---|---|---|
| CN | 101266915 A | 9/2008 |
| JP | 2001-223190 A | 8/2001 |

OTHER PUBLICATIONS

Light Bulb Camera Fount at: https://www.amazon.com/Fisheye-Wireless-Security-Cameras-Detection/dp/B07G2WX68Q#customerReviews (Year: 2018).*
International Search Report dated Jul. 2, 2022 for Application No. PCT/US2022/023121, 11 pages.

* cited by examiner

Primary Examiner — Don M Anderson
Assistant Examiner — Caleb Andrew Holizna
(74) Attorney, Agent, or Firm — Patterson + Sheridan, LLP

(57) ABSTRACT

An apparatus and method for to monitoring slurry buildup is disclosed. A substrate polishing apparatus includes a surface coated at least in part with a fluorescent material, a light source configured to illuminate the surface, an image sensor configured to image the surface, and a processor coupled to the image sensor and configured to monitor slurry buildup on the surface using data supplied from the image sensor.

8 Claims, 5 Drawing Sheets

CHEMICAL MECHANICAL POLISHING SLURRY BUILDUP MONITORING

BACKGROUND

Field

Embodiments of the present disclosure generally relate to chemical mechanical polishing (CMP) systems used in the manufacturing of semiconductor devices. In particular, embodiments herein relate to monitoring slurry buildup in CMP systems.

Description of the Related Art

Chemical mechanical polishing (CMP) is commonly used in the manufacturing of semiconductor devices to planarize or polish a layer of material deposited on a substrate surface. During a CMP process, a substrate is retained in a substrate carrier which presses the backside of the substrate towards a rotating polishing pad in the presence of a polishing fluid. Material is removed across the material layer surface of the substrate in contact with the polishing pad through a combination of chemical and mechanical activity which is provided by the polishing fluid and the relative motion of the substrate and the polishing pad.

Polishing fluid used in a CMP process may include an aqueous solution of one or more chemical constituents along with nanoscale abrasive particles suspended in the aqueous solution. Commonly, dried residues of the polishing fluid, such as agglomerations of abrasive particles, accumulate on component surfaces that are disposed above or otherwise proximate to the polishing pad during the polishing process. For example, dried residues of the polishing fluid often accumulate on surfaces of CMP system components that are disposed over a polishing pad as a polishing fluid is dispensed thereon, such as substrate carriers, pad conditioner assemblies, and/or fluid delivery arms. If the accumulated residue is not removed, agglomerations of abrasive particles may flake from the component surfaces onto the polishing pad and cause undesirable damage to the material surface of a substrate subsequently polished thereon. This damage often manifests as scratches, e.g., micro-scratches, on the substrate surface which may detrimentally affect the performance of a device formed thereon or in some circumstances, may render the device inoperable.

Unfortunately, removing the accumulated residue from component surfaces is generally laborious and time-consuming as the agglomerated abrasive particles often form cement-like layers. The result is undesirable extended and frequent polishing system downtime for consumable change-out and/or preventive maintenance procedures where the accumulated residue is manually cleaned from the component surfaces.

Accordingly, there is a need in the art for apparatus and methods that solve the problems described above.

SUMMARY

The present disclosure generally relates to chemical mechanical polishing (CMP) systems used in the manufacturing of semiconductor devices. In particular, embodiments herein relate to monitoring slurry buildup in CMP systems.

In one embodiment, a substrate polishing apparatus includes a surface coated at least in part with a fluorescent material, a light source configured to illuminate the surface, an image sensor configured to image the surface, and a processor coupled to the image sensor and configured to monitor slurry buildup on the surface using data supplied from the image sensor.

In another embodiment, a slurry buildup monitoring method includes capturing an image of a surface of a polishing apparatus. The surface is coated at least in part with a fluorescent material. The method includes selecting an area of interest in the image and determining a fluorescent parameter of the area of interest where a value of the fluorescent parameter corresponds to an amount of slurry buildup on the area of interest.

In yet another embodiment, a substrate polishing apparatus includes a surface coated at least in part with a fluorescent material, a light source configured to illuminate the surface, a sensor configured to measure fluorescent intensity of an area of interest on the surface, and a non-transitory computer readable medium having instructions stored thereon for a monitoring method. The monitoring method includes polishing a substrate in the substrate polishing apparatus with a slurry. Slurry buildup on the surface reduces measurable fluorescent intensity of the area of interest. The method includes switching on the light source and when the light source is switched on, measuring a fluorescent intensity of the area of interest using the sensor. The method includes comparing the measured fluorescent intensity to a first range and creating an alert if the measured fluorescent intensity is outside the first range.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure generally relate to chemical mechanical polishing (CMP) systems used in the manufacturing of semiconductor devices. In particular, embodiments herein relate to monitoring slurry buildup in CMP systems.

Apparatus and/or methods disclosed herein provide monitoring of slurry buildup on internal surfaces of a CMP tool. During conventional CMP processing in which slurry buildup is not monitored, defects resulting from slurry residue falling on the wafer surface may be the earliest and perhaps the only indication that cleaning is needed. Therefore, when defects are detected that may be attributed to slurry buildup, the tool may be taken offline for cleaning or scheduled for cleaning even if cleaning was not previously planned, Scheduling cleaning in this way (i.e., based on observation of defects resulting from the CMP process) is inefficient, causes wafer scrap and lowers overall process throughput. In contrast, apparatus and/or methods disclosed herein facilitate scheduling cleanings based on slurry buildup alone (e.g., before slurry buildup results in defects). Scheduling cleaning based on slurry buildup alone results in more efficient scheduling, increases overall process throughput, and reduces or prevents the occurrence of defects which may result from lack of cleaning.

In some alternative CMP processes, the CMP tool may be taken offline for cleaning at pre-planned intervals regardless of the actual buildup of slurry in order to prevent defects which may be attributed to slurry buildup. However, this approach may also reduce overall process throughput by performing cleaning of tools before cleaning is really needed. In contrast, using apparatus and/or methods disclosed herein, cleaning is only scheduled when needed, resulting in more efficient cleaning scheduling with less tool downtime.

Apparatus and/or methods disclosed herein provide monitoring of slurry buildup for targeting only certain areas of a CMP tool for cleaning, in contrast to conventional approaches in which various internal surfaces are cleaned regardless of the actual buildup of slurry. Therefore, apparatus and/or methods disclosed herein provide more efficient cleaning of selected surfaces with less tool downtime. Furthermore, by prioritizing surfaces most in need of cleaning, a cleaning process can be optimized for more effective cleaning. Apparatus and/or methods disclosed herein also provide monitoring of slurry buildup to help identify problem areas for future continuous improvement programs.

Figure 1A:
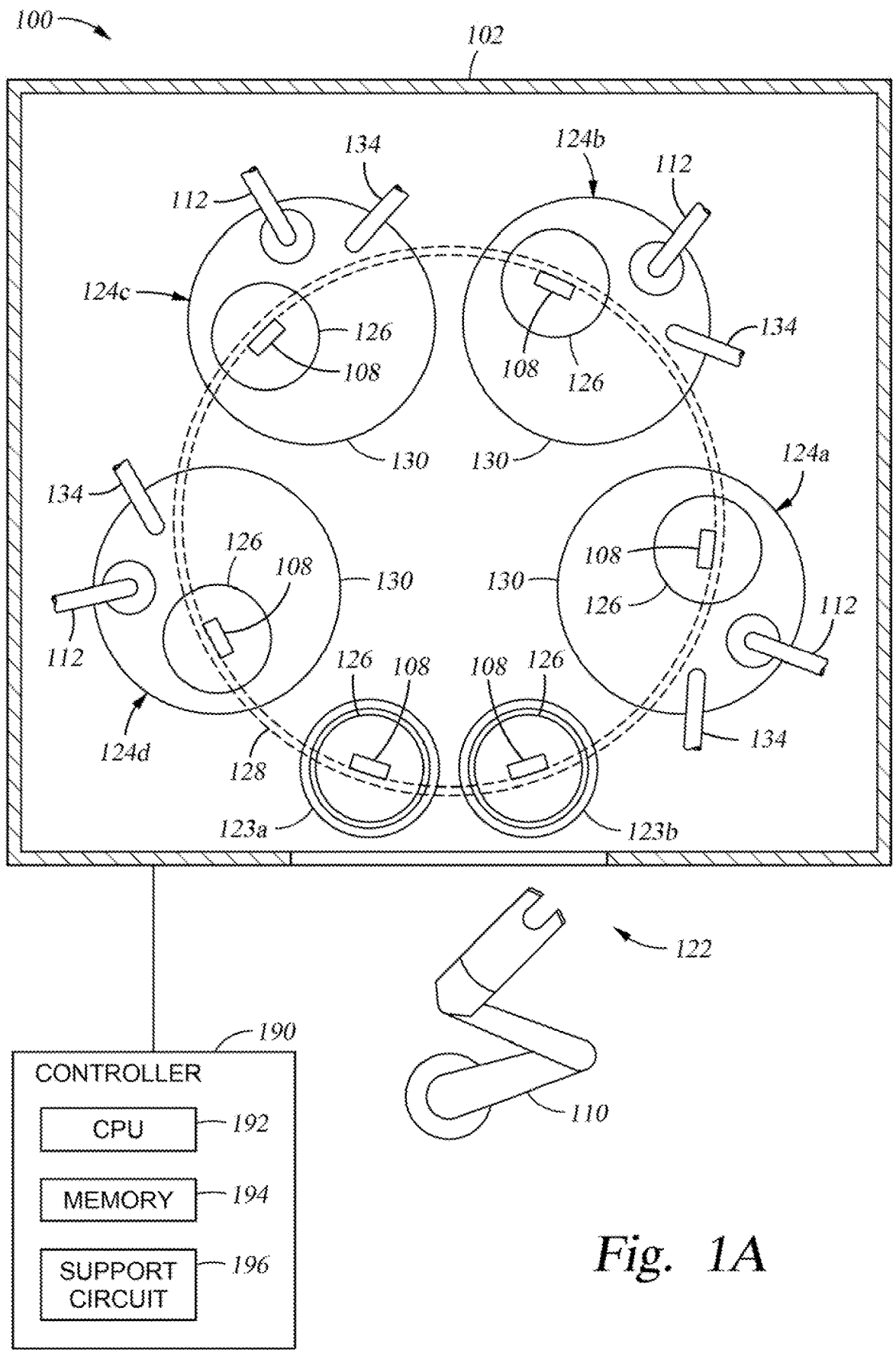
FIG. 1A is a plan view of a polishing apparatus, according to one or more embodiments.

FIG. 1A is a plan view of a polishing apparatus 100, such as a chemical mechanical polishing (CMP) tool for processing one or more substrates. The polishing apparatus 100 includes a polishing platform, or base 102 that at least partially supports and houses a plurality of polishing stations 124. For example, the polishing apparatus 100 shown includes four polishing stations 124a, 124b, 124c and 124d. Each polishing station 124 is adapted to polish a substrate that is retained in a carrier head 126.

The polishing apparatus 100 also includes a plurality of carrier heads 126, each of which is configured to carry a substrate. The number of carrier heads can be a number equal to or greater than the number of polishing stations, e.g., four carrier heads or six carrier heads. For example, the number of carrier heads can be two greater than the number of polishing stations. This permits loading and unloading of substrates to be performed from two of the carrier heads while polishing occurs with the other carrier heads at the remainder of the polishing stations, thereby providing improved throughput.

The polishing apparatus 100 also includes a transfer station 122 for loading and unloading substrates from the carrier heads 126. The transfer station 122 can include a plurality of load cups 123, e.g., two load cups 123a and 123b, adapted to facilitate transfer of a substrate between the carrier heads 126 and a factory interface (not shown) or other device (not shown) by a transfer robot 110. The load cups 123 generally facilitate transfer between the robot 110 and each of the carrier heads 126.

The stations of the polishing apparatus 100, including the transfer station 122 and the polishing stations 124, can be positioned at substantially equal angular intervals around the center of the base 102. This is not required, but can provide the polishing apparatus 100 with a reduced footprint.

Figure 1B:
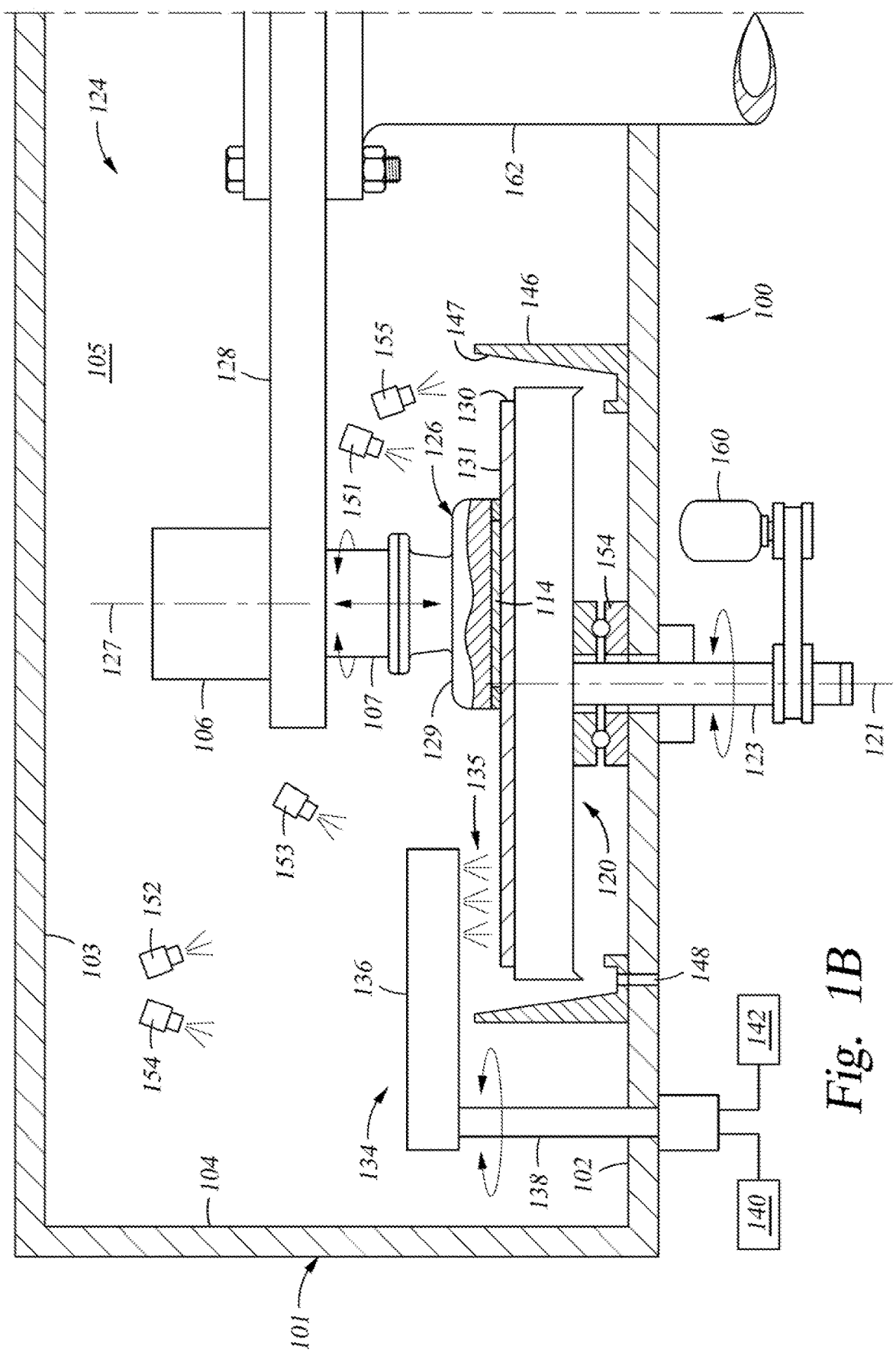
FIG. 1B is a schematic, partial cross-sectional side view of FIG. 1A.
Figure 1C:
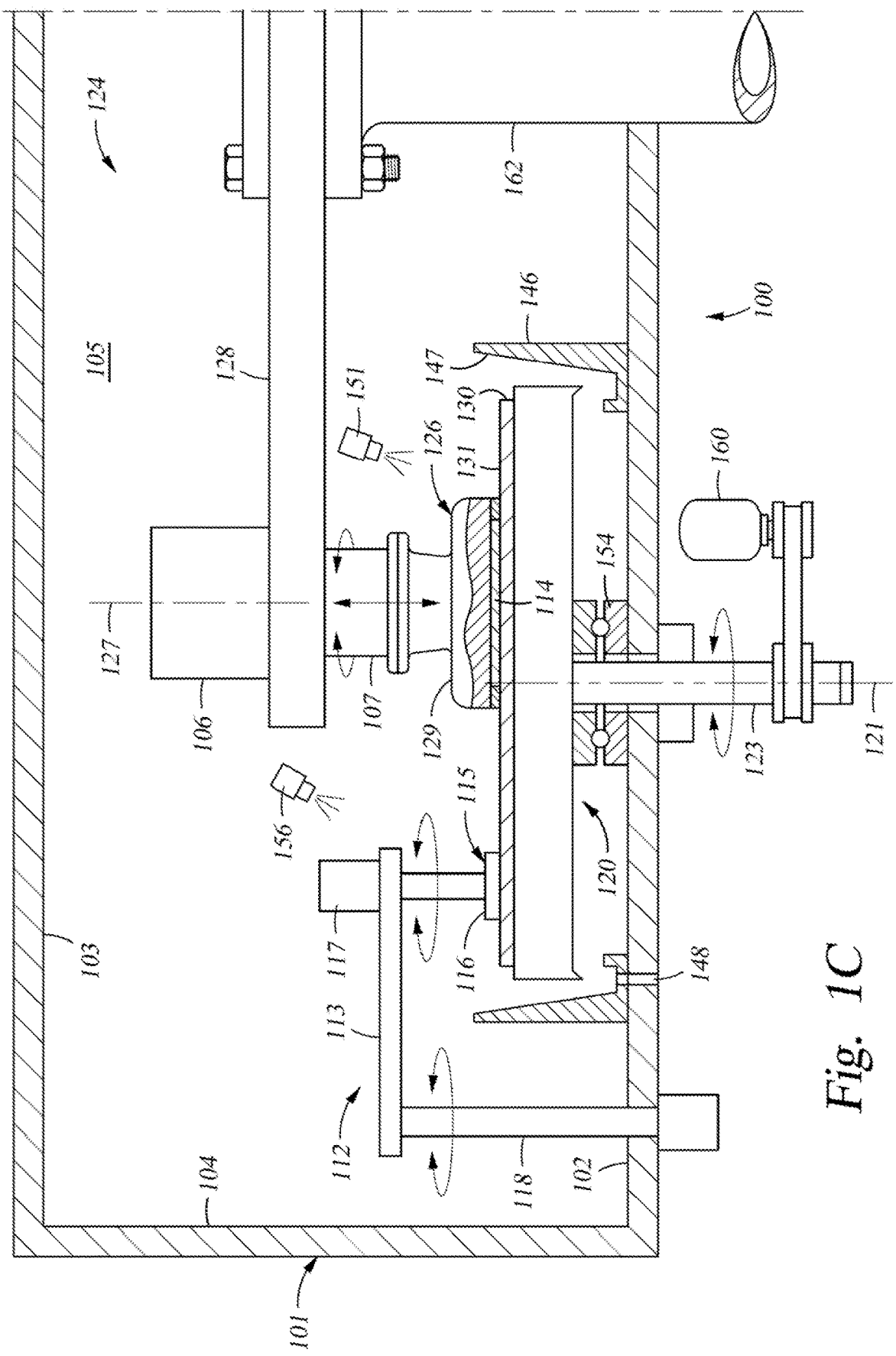
FIG. 1C is a schematic, partial cross-sectional side view of FIG. 1A.

Each polishing station 124 includes a polishing pad 130 supported on a platen 120 (shown in FIGS. 1B-1C). For a polishing operation, one carrier head 126 is positioned at each polishing station 124. Two additional carrier heads can be positioned in the transfer station 122 to exchange polished substrates for unpolished substrates while the other substrates are being polished at the polishing stations 124.

The carrier head 126 is adapted to hold a substrate against a polishing surface of the polishing pad 130, while relative motion is provided between the carrier head 126 and the platen 120 to polish the substrate. The relative motion may be rotational, lateral, or some combination thereof, and is provided by at least one of the carrier head 126 and the platen 120. Each carrier head 126 can have independent control of the polishing parameters, for example pressure, associated with each respective substrate.

The carrier heads 126 are held by a support structure that can cause each carrier head to move along a path that passes, in order, the first polishing station 124a, the second polishing station 124b, the third polishing station 124c, and the fourth polishing station 124d. This permits each carrier head to be selectively positioned over each of the polishing stations 124 and load cups 123.

In some implementations, each carrier head 126 is coupled to a carriage 108 that is mounted to an overhead track 128. By moving a carriage 108 along the overhead track 128, the respective carrier head 126 can be positioned over a selected polishing station 124 or load cup 123. A carrier head 126 that moves along the overhead track 128 traverses the path past each of the polishing stations 124.

In the implementation shown in FIG. 1A, the overhead track 128 has a circular configuration (shown in phantom) which allows the carriages 108 retaining the carrier heads 126 to be selectively orbited over and/or clear of the load cups 123 and the polishing stations 124. The overhead track 128 may have other configurations including elliptical, oval, linear or other suitable orientation. Alternatively, in some implementations (not shown) the carrier heads 126 are suspended from a carousel, and rotation of the carousel moves all of the carrier heads 126 simultaneously along a circular path. Although the polishing apparatus illustrated herein is outfitted with an overhead track, the present disclosure may utilize any suitable polishing apparatus. In one example, the polishing apparatus may have a robot which provides the same functionality as the overhead track.

Each polishing station 124 of the polishing apparatus 100 includes a spray bar 134 to dispense polishing fluid, such as abrasive slurry, onto the polishing pad 130 as shown in more detail in FIG. 1B. Each polishing station 124 of the polishing apparatus 100 includes a pad conditioning apparatus 112 to abrade the polishing surface 131 of the polishing pad 130 to maintain the polishing pad 130 in a consistent abrasive state as shown in more detail in FIG. 1C.

A controller 190, such as a programmable computer, is connected to respective motors to independently control the rotation rate of the platen 120 and the carrier heads 126 as described in more detail below. For example, each motor can include an encoder that measures the angular position or rotation rate of the associated drive shaft. Similarly, the controller 190 is connected to an actuator in each carriage 108 to independently control the lateral motion of each carrier head 126. For example, each actuator can include a linear encoder that measures the position of the carriage 108 along the overhead track 128.

The controller 190 includes a programmable central processing unit (CPU) 192, which is operable with a memory 194 (e.g., non-volatile memory) and support circuits 196.

The support circuits 196 are conventionally coupled to the CPU 192 and comprise cache, clock circuits, input/output subsystems, power supplies, and the like, and combinations thereof coupled to the various components of the polishing apparatus 100.

In some embodiments, the CPU 192 is one of any form of general purpose computer processor used in an industrial setting, such as a programmable logic controller (PLC), for controlling various monitoring system component and sub-processors. The memory 194, coupled to the CPU 192, is non-transitory and is typically one or more of readily available memory such as random access memory (RAM), read only memory (ROM), floppy disk drive, hard disk, or any other form of digital storage, local or remote.

Herein, the memory 194 is in the form of a computer-readable storage media containing instructions (e.g., non-volatile memory), that when executed by the CPU 192, facilitates the operation of the polishing apparatus 100. The instructions in the memory 194 are in the form of a program product such as a program that implements the methods of the present disclosure (e.g., middleware application, equipment software application, etc.). The program code may conform to any one of a number of different programming languages. In one example, the disclosure may be implemented as a program product stored on computer-readable storage media for use with a computer system. The program (s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Although illustrated as a single computer, the controller 190 could be a distributed system, e.g., including multiple independently operating processors and memories. The computer architecture is adaptable to various polishing operations based on programming of the controller 190 to control the order and timing that the carrier heads are positioned at the polishing stations.

For example, a mode of operation is for the controller to cause a substrate to be loaded into a carrier head 126 at one of the load cups 123, and for the carrier head 126 to be positioned in turn at each polishing station 124a, 124b, 124c and 124d so that the substrate is polished at each polishing station in sequence. After polishing at the last station, the carrier head 126 is returned to one of the load cups 123 and the substrate is unloaded from the carrier head 126.

FIG. 1B is a schematic, partial cross-sectional side view of FIG. 1A illustrating an exemplary spray bar 134 in combination with polishing station 124. The polishing apparatus 100 has a housing 101. The housing 101 generally includes the base 102, an upper wall 103, and a sidewall 104 between the base 102 and the upper wall 103. The base 102, upper wall 103, and sidewall 104 define a processing region 105 of the polishing apparatus 100.

The carrier head 126 has a housing 129. The carrier head 126 is coupled to the overhead track 128 which is coupled to a column 162 and which extends over the platen 120. A drive system 106 is coupled the carrier head 126 by a drive shaft 107. The drive system 106 provides at least rotational motion to the carrier head 126. The drive system 106 may also provide lateral motion to the carrier head 126 to impart a sweeping motion to the carrier head 126 relative to the platen 120, e.g., by driving the carriage 108 on the overhead track 128. The carrier head 126 is actuatable toward and away from the platen 120 such that a substrate 114 retained in the carrier head 126 may be disposed against the polishing pad 130 during polishing.

The platen 120 at each polishing station 124 is rotatable about an axis 121. For example, a motor 160 turns a drive shaft 125 to rotate the platen 120. The platen 120 is rotationally disposed on the base 102. A bearing 158 is disposed between the platen 120 and the base 102 to facilitate rotation of the platen 120 relative to the base 102.

In operation, the platen 120 is rotated about axis 121, and each carrier head 126 is rotated about a respective axis 127 and translated laterally across the polishing surface 131. The lateral sweep is in a direction parallel to the polishing surface 131. The lateral sweep can be a linear or arcuate motion.

Each spray bar 134 delivers polishing fluid, such as slurry 135, to an associated polishing pad 130 to facilitate the substrate polishing operation. In addition, the spray bar 134 can deliver a cleaning fluid, e.g., deionized water, to the polishing pad 130 to rinse polishing byproducts from the polishing surface 131. The spray bar 134 includes an arm 136 having a plurality of fluid dispensing ports (not shown) in a distal end for spraying fluid, such as slurry 135, onto the polishing surface 131 as shown in FIG. 1B. A proximal end of the arm 136 is coupled to a base 138 which extends upward from the base 102 of the housing 101. The base 138 is rotatable to pivot the arm 136 between a first position disposed over the platen 120 (shown in FIG. 1B) and a second position disposed adjacent the platen 120. During polishing, the spray bar 134 is located in the first position and slurry 135 is applied onto the polishing surface 131 as the platen 120 rotates.

The spray bar 134 is fluidly coupled to one or more fluid sources outside the processing region 105, such as slurry source 140 and deionized water source 142. Although only slurry and deionized water sources are illustrated, the spray bar 134 may utilize numerous additional fluid chemistries as known in the art. For example, other suitable fluid chemistries may include alcohols, amphiphilic compounds (e.g., detergents, soaps, lipoproteins, surfactants, synthetic amphiphiles, naturally-occurring amphiphiles), acids (e.g., citric acid, hydrogen peroxide), bases, oxidizing agents, reducing agents, hydrophilic compounds, hydrophobic compounds (e.g., oils, fats, waxes), or mixtures thereof.

FIG. 1C is a schematic, partial cross-sectional side view of FIG. 1A illustrating an exemplary pad conditioning apparatus 112 in combination with polishing station 124. The cross-sectional view of FIG. 1C is taken at a different angle from that of FIG. 1B, for example about 90 degrees apart. Each pad conditioning apparatus 112 includes an arm 113 which supports a conditioner head 115 over a respective platen 120. The arm 113 is rotatably secured to the base 102. A distal end of the arm 113 is coupled to a housing 116 of the conditioner head 115. A motor 117 is coupled to the distal end of the arm 113 for rotating the conditioner head 115 during pad conditioning. A proximal end of the arm 113 is coupled to a base 118 which extends upward from the base 102 of the housing 101. The base 118 is rotatable to pivot the arm 113 and laterally translate the conditioner head 115 across the polishing surface 131.

Each polishing station 124 of the polishing apparatus 100 includes a station cup 146 radially surrounding the platen 120. The station cup 146 has an inner sidewall surface 147 facing the platen 120. The inner sidewall surface 147 extends above the polishing surface 131. Slurry 135 from the polishing pad 130 contacts the inner sidewall surface 147 and collects inside the station cup 146. A drain 148 in the bottom of the station cup 146 and/or through the base 102 is used for draining slurry 135 collected inside the station cup 146.

In operation, buildup of slurry 135 may occur on surfaces inside the housing 101 due to incidental splashing, spraying, and/or aerosolization. For example, slurry 135 may buildup on surfaces of the carrier head 126, structures above the carrier head 126 such as the overhead track 128, the spray bar 134, the sidewall 104, the station cup 146, or the pad conditioning apparatus 112. In order to facilitate monitoring of the buildup of slurry 135, one or more surfaces are coated at least in part with a fluorescent material. When a fluorescent material coating is used with a non-fluorescing slurry, fluorescent intensity is inversely correlated to slurry buildup such that surfaces with lower fluorescent intensity, or brightness, correspond to higher levels of slurry buildup.

One or more areas of interest on each surface may be coated with the fluorescent material. Alternatively, the entire surface may be coated with the fluorescent material. In some embodiments, the fluorescent material includes fluorescent paint or fluorescent tape. In some embodiments, the fluorescent material may fluoresce when exposed to ultraviolet radiation. The areas of interest may correspond to particular problem areas. Alternatively, the areas of interest may be areas which are representative of slurry buildup on the surface as a whole. In some embodiments, the fluorescent material is applied to areas of interest on a plurality of different surfaces.

In some other embodiments, instead of using a fluorescent material coating, the slurry 135 itself may include a fluorescent additive to facilitate monitoring of slurry buildup. In such embodiments, fluorescent intensity is positively correlated to slurry buildup such that surfaces with higher fluorescent intensity, or brightness, correspond to higher levels of slurry buildup.

In order to monitor the buildup of slurry 135 on a surface, the polishing apparatus 100 includes at least one light source for illuminating the surface, at least one sensor for measuring fluorescent intensity of an area of interest on the surface, and a processor for monitoring slurry buildup on the surface. In the illustrated embodiments, the polishing apparatus includes a plurality of cameras for illuminating and detecting fluorescent intensity of particular areas of interest within the polishing apparatus 100. In FIGS. 1B-1C, the cameras are shown schematically. Each camera may be mounted to a support (not shown) and/or coupled directly or indirectly to a respective component of the polishing apparatus 100. In some embodiments, each camera is fixed relative to the polishing apparatus 100. In some other embodiments, one or more cameras are movable relative to the polishing apparatus 100 for repositioning and/or re-orienting the camera to change a field of view thereof. Further, each of the cameras are coupled to and controlled by the controller 190 (FIG. 1A).

In some implementations, buildup of slurry 135 may occur predominantly on upward-facing surfaces in close proximity to the platen 120. Therefore, it may be desirable to position one or more of the plurality of cameras for top-down viewing of surfaces adjacent to the platen 120, such as nearby surfaces which are vertically above, vertically below, or radially surrounding the platen 120.

In some embodiments, each camera includes a light source and an image sensor. Alternatively, the light source may be separate from the camera. For example, the light source may be a separate component of the polishing apparatus 100. In one example, the light source may comprise one or more lights bars within the housing 101 of the polishing apparatus 100 for illuminating the processing region 105. In some embodiments, the light source is any ultraviolet light source. For example, the ultraviolet light source may be a light source emitting ultraviolet radiation in the range of about 315 nm to about 400 nm, which is commonly referred to as ultraviolet A radiation, or black light. In some embodiments, the light source includes an array of light-emitting diodes. In some embodiments, each camera uses a lens which is able to image an expanded field of view such as a wide-angle or fish-eye lens. In some embodiments, each camera has a filter matched to a fluorescent wavelength range of the fluorescent material. In some embodiments, a single camera is configured to image areas of interest on a plurality of different surfaces simultaneously.

The polishing apparatus 100 includes a camera 151 disposed above the carrier head 126. The camera 151 may be coupled to at least one of the overhead track 128 or carriage 108 (shown in FIG. 1A). The position and orientation of the camera 151 enables imaging of a surface of the carrier head 126, such as a surface of the housing 129.

The polishing apparatus 100 includes a camera 152 disposed above the polishing station 124. The camera 152 may be coupled to at least one of the upper wall 103 or sidewall 104. The position and orientation of the camera 152 enables imaging of a surface of the carrier head 126 or a surface of one or more structures above the carrier head 126, such as the overhead track 128, drive system 106, drive shaft 107, or carriage 108 (shown in FIG. 1A).

The polishing apparatus 100 includes a camera 153 disposed above the spray bar 134. The camera 153 may be coupled to at least one of the upper wall 103, sidewall 104, overhead track 128, drive system 106, or carriage 108 (shown in FIG. 1A). The position and orientation of the camera 153 enables imaging of a surface of the spray bar 134, such as a surface of the arm 136.

The polishing apparatus 100 includes a camera 154 disposed in the processing region 105, e.g., adjacent to the camera 152. The camera 154 may be coupled to at least one of the upper wall 103, sidewall 104, overhead track 128, drive system 106, or carriage 108 (shown in FIG. 1A). The position and orientation of the camera 154 enables imaging of a surface of the sidewall 104.

The polishing apparatus 100 includes a camera 155 disposed above the station cup 146. The camera 155 may be coupled to at least one of the overhead track 128, drive system 106, or carriage 108 (shown in FIG. 1A). The position and orientation of the camera 155 enables imaging of a surface of the station cup 146, such as the inner sidewall surface 147.

The polishing apparatus 100 includes a camera 156 disposed above the pad conditioning apparatus 112. The camera 156 may be coupled to at least one of the upper wall 103, sidewall 104, overhead track 128, drive system 106, or carriage 108 (shown in FIG. 1A). The position and orientation of the camera 156 enables imaging of a surface of the pad conditioning apparatus 112, such as a surface of the arm 113, conditioner head 115, or motor 117.

Figure 2:
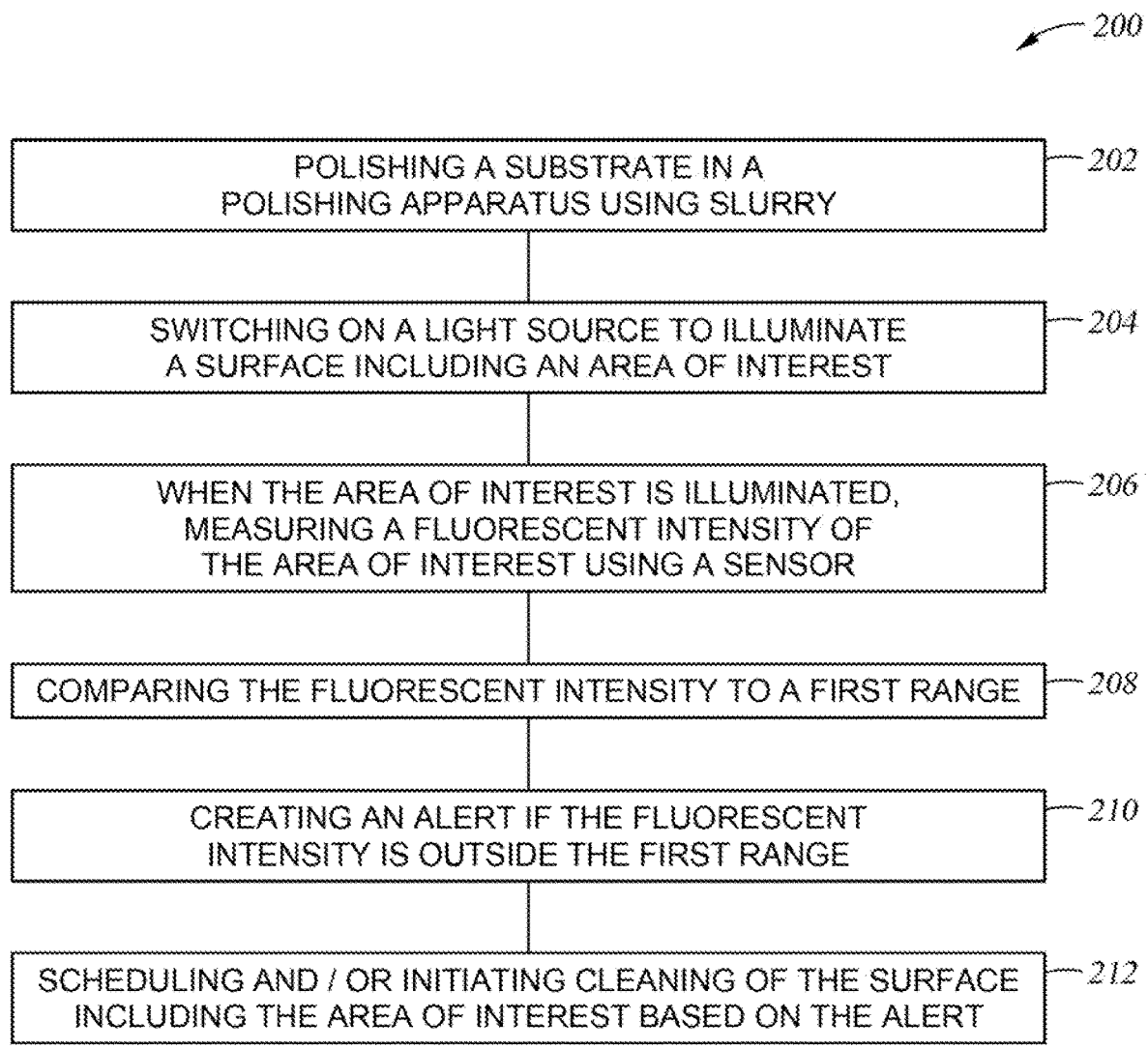
FIG. 2 is a diagram illustrating a method for monitoring slurry buildup, according to one or more embodiments.
Figure 3:
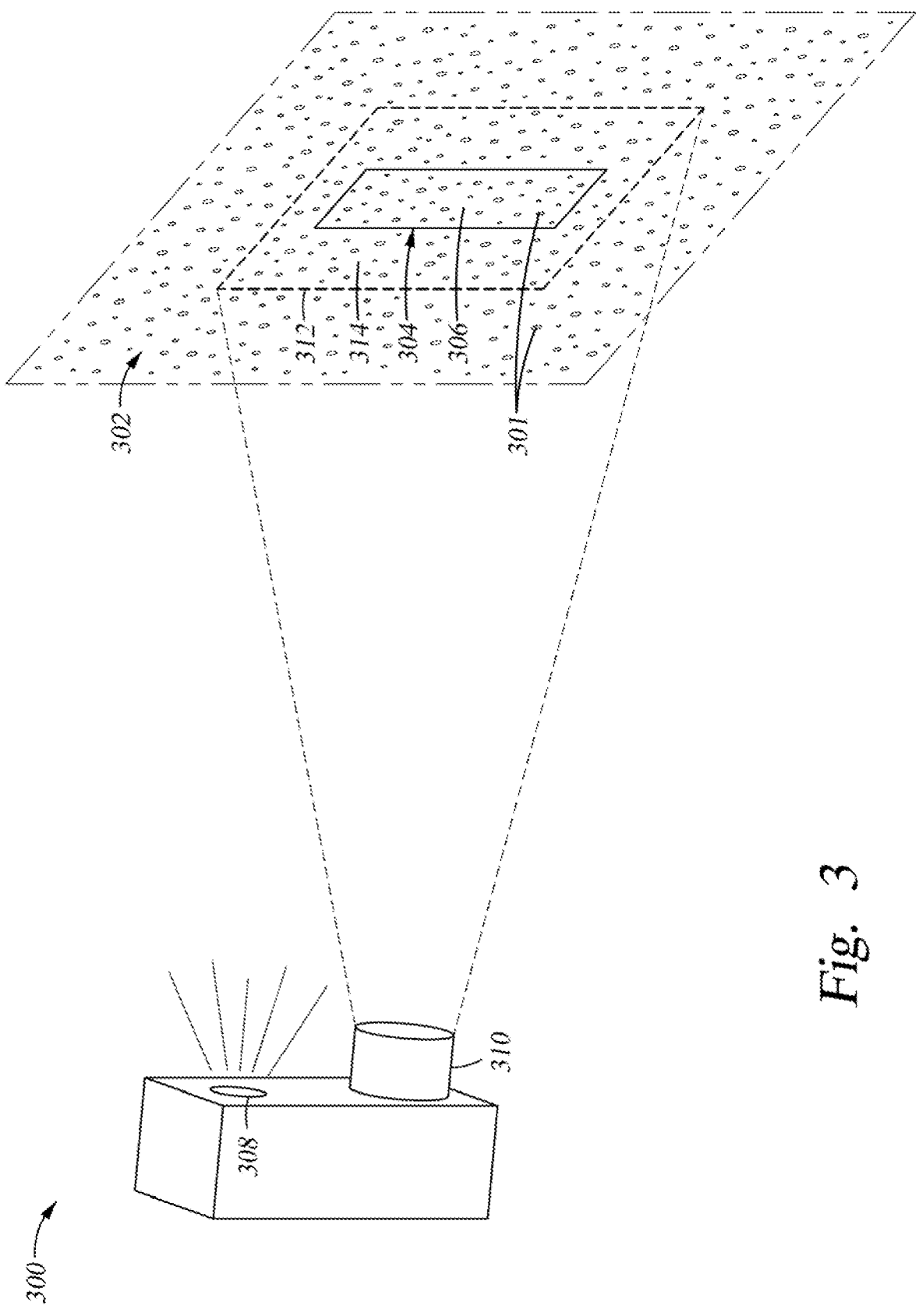
FIG. 3 is a schematic diagram illustrating an exemplary setup for monitoring slurry buildup on a surface, according to one or more embodiments.

FIG. 2 is a diagram illustrating a method 200 for monitoring slurry buildup. The method 200 may be performed by the controller 190. In one example, the controller 190 includes a non-transitory computer readable medium having instructions stored thereon for performing the method 200. At activity 202, a substrate 114 is polished in the polishing apparatus 100 using slurry 135. In particular, slurry 135 is dispensed from the spray bar 134 onto the polishing surface 131 of the polishing pad 130 as shown in FIG. 1B. As described above, some slurry buildup may occur on surfaces inside the housing 101 due to incidental splashing, spraying, and/or aerosolization. Normally slurry buildup would be undetectable. However, as disclosed herein, one or more areas of interest on internal surfaces of the polishing apparatus 100 are coated with a fluorescent material. Therefore, slurry buildup on an area of interest covers the fluorescent coating which reduces the measurable fluorescent intensity, or brightness, of the fluorescent material in the area of interest. FIG. 3 is a schematic diagram illustrating an exemplary setup 300 for monitoring slurry buildup 301 on a surface 302. Referring to FIG. 3, an area of interest 304 is coated with fluorescent material 306. As portions of the fluorescent material 306 are covered by slurry buildup 301, the measurable fluorescent intensity of the area of interest 304 decreases.

At activity 204, a light source 308 is switched on to illuminate the surface 302 including the area of interest 304. In some embodiments, the light source is switched on for a time period of about 1 second or less, such as about 1 millisecond to about 1 second, such as about 1 millisecond to about 100 milliseconds, such as about 1 millisecond to about 10 milliseconds. It may be desirable to limit the exposure time in order to reduce the potential for photo corrosion of the substrate 114 or other sensitive materials inside the housing 101 of the polishing apparatus 100. In some embodiments, ancillary lighting such as normal room lighting in the fab may optionally be turned off when the light source 308 is switched on to prevent interference with fluorescent measurements as described in more detail below.

At activity 206, when the area of interest 304 is illuminated, a fluorescent intensity of the area of interest is measured using a sensor, such as image sensor 310. The fluorescent intensity may correspond to an amount of slurry buildup 301 on the area of interest 304. In some embodiments, the sensor may be calibrated to work optimally with a specific type of fluorescent material and lighting being implemented. In some embodiments, sensor measurements may be normalized to a fluorescent intensity of the fluorescent material in a clean state. In the illustrated embodiments with the image sensor 310, measurement of the fluorescent intensity includes capturing an image of the surface using the image sensor 310. In one example, the light source 308 and image sensor 310 are comprised in a camera such as one of the cameras 151-156 shown in FIGS. 1B and 1C. Although an image sensor is depicted in the illustrated embodiments, any suitable fluorescence measurement sensor may be used.

In some embodiments, the sensor measurements include data representing fluorescence which is outside the area of interest 304. For example, the image sensor 310 may capture an image of an area 312 which includes the area of interest 304 and regions surrounding the area of interest 314. In such embodiments, data processing is performed in order to select the area of interest 304 before determining the fluorescent intensity. For example, when the captured image includes regions surrounding the area of interest 314, the area of interest 304 may be selected by applying a computer algorithm to the image. In order to provide an actionable indication of slurry buildup, it may be desirable to convert the fluorescent intensity of the area of interest 304 to a number that represents the amount of slurry buildup 301.

At activity 208, the fluorescent intensity is compared to a first range. The first range may include a lower limit of fluorescent intensity in the area of interest below which the area of interest is considered in need of cleaning. In other words, measured fluorescent intensity within the first range may be considered "clean," whereas measured fluorescent intensity outside the first range may be considered "dirty." For example, the lower limit of the first range may correspond to a threshold level for residue thickness, percent residue coverage, and/or residue non-uniformity in the area of interest.

In some examples, residue non-uniformity in the area of interest may be monitored instead of or in addition to overall fluorescent intensity as described above. Residue non-uniformity may be an especially helpful parameter to track after bringing a polishing apparatus back online after cleaning. That is because changes in slurry buildup may be detectable through measurements of non-uniformity of the fluorescent intensity before those same changes become apparent In terms of the overall fluorescent intensity. In other words, uniformity of the fluorescent intensity in the area of interest may be reduced by a detectable amount as slurry buildup occurs even before a change in overall fluorescent intensity becomes detectable. In one example, edge detection of discrete spots where slurry buildup occurs may be used in conjunction with fluorescent intensity measurements to help monitor changes in non-uniformity.

At activity 210, an alert is created if the fluorescent intensity is outside the first range or satisfies a threshold condition associated with the first range. The alert may include a user message indicating there is a need for cleaning. The alert may specify a particular surface in need of cleaning, such as the surface corresponding to the area of interest which is identified as being outside the first range. The alert may include a summary screen to show the user one or more ratings representing slurry buildup on different surfaces of the polishing apparatus 100.

At activity 212, cleaning of the surface including the area of interest is scheduled and/or initiated based on the alert. In some embodiments, cleaning is performed while the polishing apparatus 100 remains online. For example, in between polishing, components of the polishing apparatus 100, such as the carrier head 126 or spray bar 134, may be rinsed, or washed, intermittently with deionized water or another suitable rinse fluid. Using apparatus and/or methods disclosed herein, rinsing may be scheduled and/or initiated based on the alert. Furthermore, using apparatus and/or methods disclosed herein, rinsing may be modified such as by providing a longer rinsing time or a specific spray recipe for targeted cleaning of the surface including the area of interest corresponding to the alert at activity 210.

In some other embodiments, the polishing apparatus 100 is taken offline to perform preventative maintenance cleaning. For example, when the polishing apparatus 100 is offline, components of the polishing apparatus 100 may be manually wiped down. Using apparatus and/or methods disclosed herein, preventative maintenance cleaning may be scheduled based on the alert. For example, cleaning of at least the surface including the area of interest corresponding to the alert at activity 210 may be scheduled automatically. Scheduling tool cleaning only when needed provides more efficient cleaning schedules with less tool downtime. Furthermore, targeting only certain areas of the polishing apparatus 100 for cleaning provides more efficient cleaning of selected surfaces with less tool downtime. In addition, the cleaning process can be optimized by prioritizing surfaces most in need of cleaning.

While the foregoing is directed to embodiments of the present disclosure, other and further embodiments of the disclosure may be devised without departing from the basic scope thereof, and the scope thereof is determined by the claims that follow.

The invention claimed is:

1. A substrate polishing apparatus, comprising:
a surface coated at least in part with a fluorescent material;
a light source configured to illuminate the surface;
an image sensor configured to image the surface, wherein the fluorescent material is applied to areas of interest on a plurality of surfaces, and wherein the image sensor comprises one or more cameras configured to image each of the areas of interest simultaneously; and
a processor coupled to the image sensor and configured to monitor slurry buildup on the surface using data supplied from the image sensor.

2. The substrate polishing apparatus of claim 1, wherein the surface comprises a portion of at least one of a carrier head, an overhead track, a spray bar, a sidewall, a station cup, or a pad conditioning apparatus.

3. The substrate polishing apparatus of claim 1, wherein the fluorescent material comprises at least one of fluorescent paint or fluorescent tape.

4. The substrate polishing apparatus of claim 1, wherein the light source comprises an ultraviolet light.

5. The substrate polishing apparatus of claim 1, wherein the light source and image sensor are comprised in a camera that uses at least one of a wide-angle or fish-eye lens configured to image an expanded field of view.

6. The substrate polishing apparatus of claim 1, wherein the image sensor comprises a filter matched to a fluorescent wavelength range of the fluorescent material.

7. The substrate polishing apparatus of claim 1, wherein the processor comprises a non-transitory computer readable medium having instructions stored thereon for a monitoring method, the monitoring method comprising:
capturing an image of the surface including the fluorescent material;
selecting an area of interest in the image; and
determining a fluorescent intensity of the area of interest, wherein the fluorescent intensity corresponds to an amount of slurry buildup on the area of interest.

8. The substrate polishing apparatus of claim 1, wherein the plurality of surfaces comprises surfaces of a carrier head, structures above the carrier head, or a pad conditioning apparatus.

* * * * *